United States Patent
Jang

(10) Patent No.: US 7,952,384 B2
(45) Date of Patent: May 31, 2011

(54) DATA TRANSMITTER AND RELATED SEMICONDUCTOR DEVICE

(75) Inventor: Young-chan Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/637,002

(22) Filed: Dec. 14, 2009

(65) Prior Publication Data

US 2010/0253386 A1    Oct. 7, 2010

(30) Foreign Application Priority Data

Apr. 2, 2009 (KR) .................. 10-2009-0028533

(51) Int. Cl.
*H03K 17/16* (2006.01)
*H03K 19/003* (2006.01)
(52) U.S. Cl. .......................................... 326/31; 708/531
(58) Field of Classification Search .................... 326/31; 708/531; 714/6, 758, 800, 801, E11.053
See application file for complete search history.

(56) References Cited

U.S. PATENT DOCUMENTS

| | | | |
|---|---|---|---|
| 5,012,126 A * | 4/1991 | Feldbaumer et al. | 327/410 |
| 6,335,841 B1 * | 1/2002 | Hirano et al. | 360/40 |
| 6,862,652 B1 * | 3/2005 | Tsuji | 711/103 |
| 2004/0068594 A1 | 4/2004 | Asaro et al. | |

FOREIGN PATENT DOCUMENTS

| | | |
|---|---|---|
| JP | 2003281884 A | 10/2003 |
| KR | 1020080051840 A | 6/2008 |
| KR | 1020080075749 A | 8/2008 |

* cited by examiner

*Primary Examiner* — Rexford N Barnie
*Assistant Examiner* — Crystal L Hammond
(74) *Attorney, Agent, or Firm* — Volentine & Whitt, PLLC

(57) ABSTRACT

A semiconductor device transmitting a plurality of data using a multilevel signal includes a parity bit control unit generating a parity bit that varies with a number of data in which a most significant bit (MSB) and least significant bit (LSB) are different. A data conversion unit either inversely outputs the MSB or the LSB, or outputs the data without a change in response to the parity bit. Transmission units transmit data provided by the data conversion unit using the multilevel signal.

9 Claims, 4 Drawing Sheets

FIG. 2A

| D0<1> | D0<0> | D1<1> | D1<0> | D2<1> | D2<0> | D3<1> | D3<0> | PB |
|---|---|---|---|---|---|---|---|---|
| H | L | L | H | L | H | H | H | H |
| H | L | L | L | H | L | H | L | H |
| L | H | H | L | L | H | L | H | H |
| H | H | L | H | H | L | H | H | L |
| H | L | L | L | H | H | H | H | L |
| L | L | H | H | H | H | L | L | L |

FIG. 2B

| D0'<1> | D0'<0> | D1'<1> | D1'<0> | D2'<1> | D2'<0> | D3'<1> | D3'<0> | PB |
|---|---|---|---|---|---|---|---|---|
| H | H | L | L | L | L | H | L | H |
| H | H | L | H | H | H | H | H | H |
| L | L | H | H | L | L | L | L | H |
| H | H | L | H | H | L | H | H | L |
| H | L | L | L | H | H | H | H | L |
| L | L | H | H | H | H | L | L | L |

FIG. 4

| D'<1> | D'<0> | V<sub>out</sub> |
|---|---|---|
| H | H | VDDQ |
| H | L | $\frac{2}{3}$ VDDQ |
| L | H | $\frac{1}{3}$ VDDQ |
| L | L | 0 |

DATA TRANSMITTER AND RELATED SEMICONDUCTOR DEVICE

CROSS-REFERENCE TO RELATED APPLICATION

This application claims the benefit of Korean Patent Application No. 10-2009-0028533 filed on Apr. 2, 2009, the subject matter of which is hereby incorporated by reference.

BACKGROUND

The inventive concept relates to semiconductor devices. More particularly, the inventive concept relates to a data transmitter and a semiconductor device including the data transmitter.

Multilevel input/output (I/O) methods have been introduced in order to transmit and receive large quantities of data without necessarily increasing data transmission speed. Multilevel I/O methods may use a variety of digital modulation techniques including, for example, pulse amplitude modulation (PAM), pulse duration modulation (PDM), and pulse position modulation (PPM).

SUMMARY

According to an aspect of the inventive concept, there is provided a semiconductor device transmitting data using a multilevel signal, the semiconductor device comprising; a parity bit control unit configured to generate a parity bit in accordance with a number of the data having a most significant bit (MSB) and a least significant bit (LSB) that are different, a data conversion unit configured to either inversely output one of the MSB and LSB, or output the data without a change in response to the parity bit, and a plurality of transmission units configured to transmit data output from the data conversion unit using the multilevel signal.

According to another aspect of the inventive concept, there is provided a transmitter transmitting data using a multilevel signal, the transmitter comprising; a first voltage control unit configured to disconnect a power voltage source and an output terminal of the transmitter when a first bit of the data is in a first logic state, a second voltage control unit configured to disconnect a ground voltage source and the output terminal of the transmitter when the first bit of the data is in a second logic state, a third voltage control unit configured to disconnect the power voltage source and the output terminal of the transmitter when the first bit and a second bit of the data are in the first logic state, a fourth voltage control unit configured to disconnect the ground voltage source and the output terminal of the transmitter when the first bit and the second bit are in the second logic state, a fifth voltage control unit configured to disconnect the power voltage source and the output terminal of the transmitter when the first bit and the second bit are in the second logic state, and a sixth voltage control unit disconnecting the ground voltage source and the output terminal of the transmitter when the first bit and the second bit are in the first logic state.

BRIEF DESCRIPTION OF THE DRAWINGS

Embodiments of the inventive concept will be more clearly understood from the following detailed description taken in conjunction with the accompanying drawings in which:

FIG. 2A is a table listing the first through fourth data of FIG. 1 and corresponding parity bits to be transmitted;

FIG. 2B is a table listing the first through fourth data of FIG. 2B and corresponding parity bits as actually transmitted;

FIG. 4 is a table listing possible voltages apparent at the output terminal of the transmitter of FIG. 3 in accordance with various logic states for the data applied to the transmitter.

DETAILED DESCRIPTION OF THE EMBODIMENTS

Figure 1:
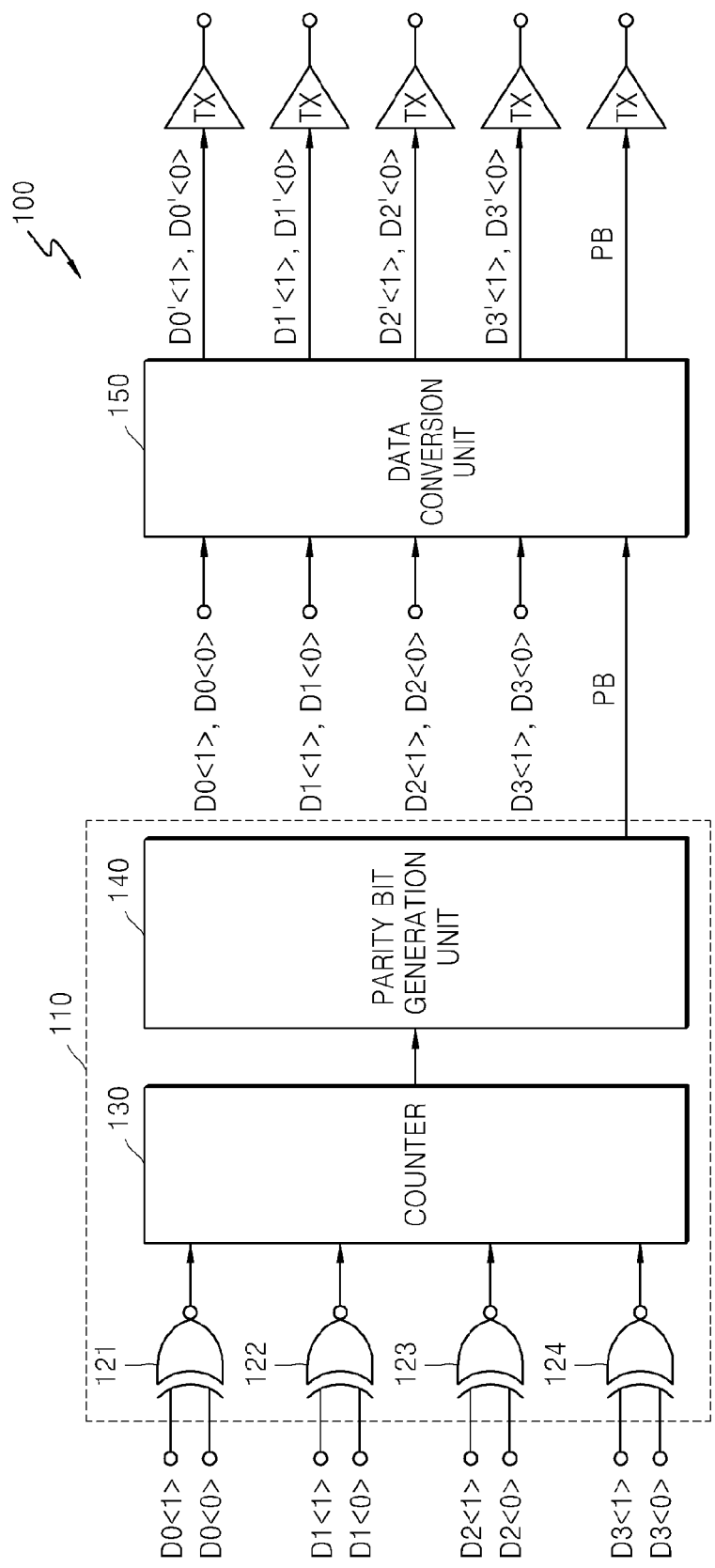
FIG. 1 is a block diagram of a semiconductor device according to an embodiment of the inventive concept.

The attached drawings illustrate several embodiments of the inventive concept and may be referred to in order to gain a better understanding of the inventive concept, the merits thereof, and the objectives accomplished by the exemplary implementations of the inventive concept.

Hereinafter, the inventive concept will be described in some additional detail with reference to the attached drawings. Like reference numerals in the drawings denote like elements.

FIG. 1 is a block diagram of a semiconductor device 100 according to an embodiment of the inventive concept. Referring to FIG. 1, the semiconductor device 100 comprises a parity bit control unit 110, a data conversion unit 150, and a plurality of transmission units TX. As illustrated in FIG. 1, the semiconductor device 100 transmits first data D0<1> and D0<0>, second data D1<1> and D1<0>, third data D2<1> and D2<0>, and fourth data D3<1> and D3<0>. However, the inventive concept is not limited to only this number and arrangement of data. Indeed, any reasonable number and arrangement of transmitted data bits is contemplated by embodiments of the inventive concept. In the following description, however, only a case wherein the first through fourth data D0<1>, D0<0>, D1<1>, D1<0>, D2<1>, D2<0>, D3<1>, and D3<0> are transmitted will be described.

The parity bit control unit 110 is configured to change the logic state of a parity bit according to the number of data in which the most significant bits (MSBs) D0<1>, D1<1>, D2<1>, and D3<1> and the least significant bits (LSBs) D0<0>, D1<0>, D2<0>, and D3<0> are different, of the first through fourth data D0<1>, D0<0>, D1<1>, D1<0>, D2<1>, D2<0>, D3<1>, and D3<0> that are transmitted by the semiconductor device 100. For example, of the first through fourth data D0<1>, D0<0>, D1<1>, D1<0>, D2<1>, D2<0>, D3<1>, and D3<0>, when the number of data in which the MSBs and the LSBs are different is not greater than half of the total number of data, the parity bit control unit 110 may change the parity status to a first logic state. When the number of data in which the MSBs and the LSBs are different is greater than half of the total number of data, the parity bit control unit 110 changes the parity status to a second logic state. In the following description, the first logic state is assumed to be a logically "low" state, while the second logic state is assumed to be a logically "high" state. However, even if these state assumptions were reversed, the benefits of the inventive concept would be similarly obtained.

The parity bit control unit 110 in the illustrated embodiment of FIG. 1 comprises first through fourth XOR gates 121, 122, 123, and 124, a counter 130, and a parity bit generation unit 140. As will be understood by those skilled in the art the choice of four XOR gates is merely illustrative, and the inventive concept is not limited thereto. Indeed, a semiconductor device designed in accordance with the inventive concept may include any reasonable number of XOR gates configured to transmit a corresponding number of data bits.

Returning to FIG. 1, the first XOR gate 121 determines whether the MSB D0<1> and the LSB D0<0> of the first data D0<1> and D0<0> have the same logic state by performing an exclusive XOR operation on the input MSB D0<1> and LSB D0<0> of the first data D0<1> and D0<0>. The second XOR gate 122 determines whether the MSB D1<1> and the LSB D1<0> of the second data D1<1> and D1<0> have the same logic state by performing an exclusive XOR operation on the input of the MSB D1<1> and the LSB D1<0> of the second data D1<1> and D1<0>. The third XOR gate 123 determines whether the MSB D2<1> and the LSB D2<0> of the third data D2<1> and D2<0> have the same logic state by performing an exclusive XOR operation on the input of the MSB D2<1> and the LSB D2<0> of the third data D2<1> and D2<0>, and the fourth XOR gate 124 similarly determines whether the MSB D3<1> and the LSB D3<0> of the fourth data D3<1> and D3<0> have the same logic state by performing an exclusive XOR operation on the input of the MSB D3<1> and the LSB D3<0> of the fourth data D3<1> and D3<0>.

The counter 130 is configured to count (i.e., to generate a "count value" indicating) the number of incidences wherein the MSB and the LSB are different between the first through fourth data D0<1>, D0<0>, D1<1>, D1<0>, D2<1>, D2<0>, D3<1>, and D3<0> using output signals received from the first through fourth XOR gates 121, 122, 123, and 124.

The parity bit generation unit 140 is configured to generate a parity bit (PB) in the first logic state when the count value is less than or equal to half of the total number of data, and to generate the parity bit (PB) in the second logic state when the count value is greater than half of the total number of data. For example, in the illustrated embodiment of FIG. 1, when the count value is less than or equal to 2, a first logic state PB is generated, but when the count value is greater than 2, a second logic state PB is generated.

The data conversion unit 150, in response to the PB provided by the parity bit control unit 110, is configured to inversely output one of the MSBs D0<1>, D1<1>, D2<1>, and D3<1> and the LSBs D0<0>, D1<0>, D2<0>, and D3<0> of the first through fourth data D0<1>, D0<0>, D1<1>, D1<0>, D2<1>, D2<0>, D3<1>, and D3<0>, or output the first through fourth data D0<1>, D0<0>, D1<1>, D1<0>, D2<1>, D2<0>, D3<1>, and D3<0> without a change. For example, when the PB is in the first logic state, the data conversion unit 150 will output the first through fourth data D0<1>, D0<0>, D1<1>, D1<0>, D2<1>, D2<0>, D3<1>, and D3<0>, without a change. However, when the PB is in the second logic state, the data conversion unit 150 will inversely output one of the MSBs D0<1>, D1<1>, D2<1>, and D3<1> and the LSBs D0<0>, D1<0>, D2<0>, and D3<0> of the first through fourth data D0<1>, D0<0>, D1<1>, D1<0>, D2<1>, D2<0>, D3<1>, and D3<0>.

The transmission units TX are configured to transmit data provided by the data conversion unit 150 using a multilevel signalling technique. One possible embodiment of the transmission units TX will be described in some additional detail with reference to FIGS. 3 and 4.

FIG. 2A is a table listing the first to fourth data D0<1>, D0<0>, D1<1>, D1<0>, D2<1>, D2<0>, D3<1>, and D3<0> and the PB of FIG. 1 to be transmitted.

FIG. 2B is a table listing the first to fourth transmission data D0'<1>, D0'<0>, D1'<1>, D1'<0>, D2'<1>, D2'<0>, D3'<1>, and D3'<0> and the PB of FIG. 1 as actually transmitted. The operation of the semiconductor device 100 will be described with reference to FIGS. 1, 2A, and 2B.

First, when the first to fourth data D0<1>, D0<0>, D1<1>, D1<0>, D2<1>, D2<0>, D3<1>, and D3<0> as in the first row of the table of FIG. 2A are to be transmitted, the MSB D0<1> of the first data D0<1> and D0<0> is in a logic high state H and the LSB D0<0> of the first data D0<1> and D0<0> is in a logic low state L, which are different logic states. Also, for the second data D1<1> and D1<0> and the third data D2<1> and D2<0>, the logic states of the MSBs D1<1> and D2<1> and the LSBs D1<0> and D2<0> are different. However, the logic states of the MSB D3<1> and the LSB D3<0> of the fourth data D3<1> and D3<0> are the same. That is, of the first to fourth data D0<1>, D0<0>, D1<1>, D1<0>, D2<1>, D2<0>, D3<1>, and D3<0>, there are three data in which the MSBs D0<1>, D1<0>, D2<1>, and D3<1> and the LSBs D0<0>, D1<0>, D2<0>, and D3<0> are different, and one data in which the MSBs D0<1>, D1<0>, D2<1>, and D3<1> and the LSBs D0<0>, D1<0>, D2<0>, and D3<0> are the same. Thus, the parity bit control unit 110 generates and outputs a PB in the logic high state H because the number of data in which the MSBs and the LSBs are different is greater than 2 (i.e., more than half of the total number of data).

The first row of the table of FIG. 2B shows the first to fourth transmission data D0'<1>, D0'<0>, D1'<1>, D1'<0>, D2'<1>, D2'<0>, D3'<1>, and D3'<0> that are actually transmitted by converting the first to fourth data D0<1>, D0<0>, D1<1>, D1<0>, D2<1>, D2<0>, D3<1>, and D3<0> in the first row of the table of FIG. 2A. That is, when the first to fourth data D0<1>, D0<0>, D1<1>, D1<0>, D2<1>, D2<0>, D3<1>, and D3<0> in the first row of the table of FIG. 2A are to be transmitted, since the PB is in the logic high state H, the data conversion unit 150 outputs the first to fourth transmission data D0'<1>, D0'<0>, D1'<1>, D1'<0>, D2'<1>, D2'<0>, D3'<1>, and D3'<0> that are obtained by changing the logic states of the LSBs D0<0>, D1<0>, D2<0>, and D3<0> of the first to fourth data D0<1>, D0<0>, D1<1>, D1<0>, D2<1>, D2<0>, D3<1>, and D3<0>, to the transmission units TX. Although, the embodiment of the inventive concept illustrated in FIG. 2B describes a case where changing the LSBs when the PB is in the logic high state H is performed, the present inventive concept is not limited to only this approach. Indeed, the same effect may be obtained in embodiments of the inventive concept that change the MSBs instead of the LSBs.

When the first to fourth data D0<1>, D0<0>, D1<1>, D1<0>, D2<1>, D2<0>, D3<1>, and D3<0> in the second row of the table of FIG. 2A are to be transmitted, since there are three data in which the MSBs D0<1>, D1<0>, D2<1>, and D3<1> and the LSBs D0<0>, D1<0>, D2<0>, and D3<0> are different, and one data in which the MSBs D0<1>, D1<0>, D2<1>, and D3<1> and the LSBs D0<0>, D1<0>, D2<0>, and D3<0> are the same, the parity bit control unit 110 generates and outputs a PB in the logic high state H. Also, when the first to fourth data D0<1>, D0<0>, D1<1>, D1<0>, D2<1>, D2<0>, D3<1>, and D3<0> in the third row of the table of FIG. 2A are to be transmitted, since there are four data in which the MSBs D0<1>, D1<0>, D2<1>, and D3<1> and the LSBs D0<0>, D1<0>, D2<0>, and D3<0> are different, of the first to fourth data D0<1>, D0<0>, D1<1>, D1<0>, D2<1>, D2<0>, D3<1>, and D3<0>, the parity bit control unit 110 generates and outputs a PB in the logic high state H.

When the first to fourth data D0<1>, D0<0>, D1<1>, D1<0>, D2<1>, D2<0>, D3<1>, and D3<0> in the second or third row of the table of FIG. 2A are to be transmitted, since the PB is in the logic high state H, the data conversion unit 150 outputs the first to fourth transmission data D0'<1>, D0'<0>, D1'<1>, D1'<0>, D2'<1>, D2'<0>, D3'<1>, and D3'<0> that are obtained by changing the logic states of the LSBs D0<0>, D1<0>, D2<0>, and D3<0> of the first to fourth data D0<1>, D0<0>, D1<1>, D1<0>, D2<1>, D2<0>, D3<1>, and D3<0>, to the transmission units TX.

When the first to fourth data D0<1>, D0<0>, D1<1>, D1<0>, D2<1>, D2<0>, D3<1>, and D3<0> in the fourth or fifth row of the table of FIG. 2A are to be transmitted, since there are two data in which the MSBs D0<1>, D1<0>, D2<1>, and D3<1> and the LSBs D0<0>, D1<0>, D2<0>, and D3<0> are different, and two data in which the MSBs D0<1>, D1<0>, D2<1>, and D3<1> and the LSBs D0<0>, D1<0>, D2<0>, and D3<0> are the same, the parity bit control unit 110 generates and outputs a PB in the logic low state L. Also, when the first to fourth data D0<1>, D0<0>, D1<1>, D1<0>, D2<1>, D2<0>, D3<1>, and D3<0> in the six row of the table of FIG. 2A are to be transmitted, since there are four data in which the MSBs D0<1>, D1<0>, D2<1>, and D3<1> and the LSBs D0<0>, D1<0>, D2<0>, and D3<0> are different, of the first to fourth data D0<1>, D0<0>, D1<1>, D1<0>, D2<1>, D2<0>, D3<1>, and D3<0>, the parity bit control unit 110 generates and outputs a PB in the logic low state L.

When the first to fourth data D0<1>, D0<0>, D1<1>, D1<0>, D2<1>, D2<0>, D3<1>, and D3<0> in the fourth, fifth, or sixth row of the table of FIG. 2A are to be transmitted, since the PB is in the logic low state L, the data conversion unit 150 outputs the first to fourth transmission data D0'<1>, D0'<0>, D1'<1>, D1'<0>, D2'<1>, D2'<0>, D3'<1>, and D3'<0> that have the same logic states as the first to fourth data D0<1>, D0<0>, D1<1>, D1<0>, D2<1>, D2<0>, D3<1>, and D3<0>, without changing the logic states of the LSBs D0<0>, D1<0>, D2<0>, and D3<0> of the first to fourth data D0<1>, D0<0>, D1<1>, D1<0>, D2<1>, D2<0>, D3<1>, and D3<0>, to the transmission units TX.

Figure 3:
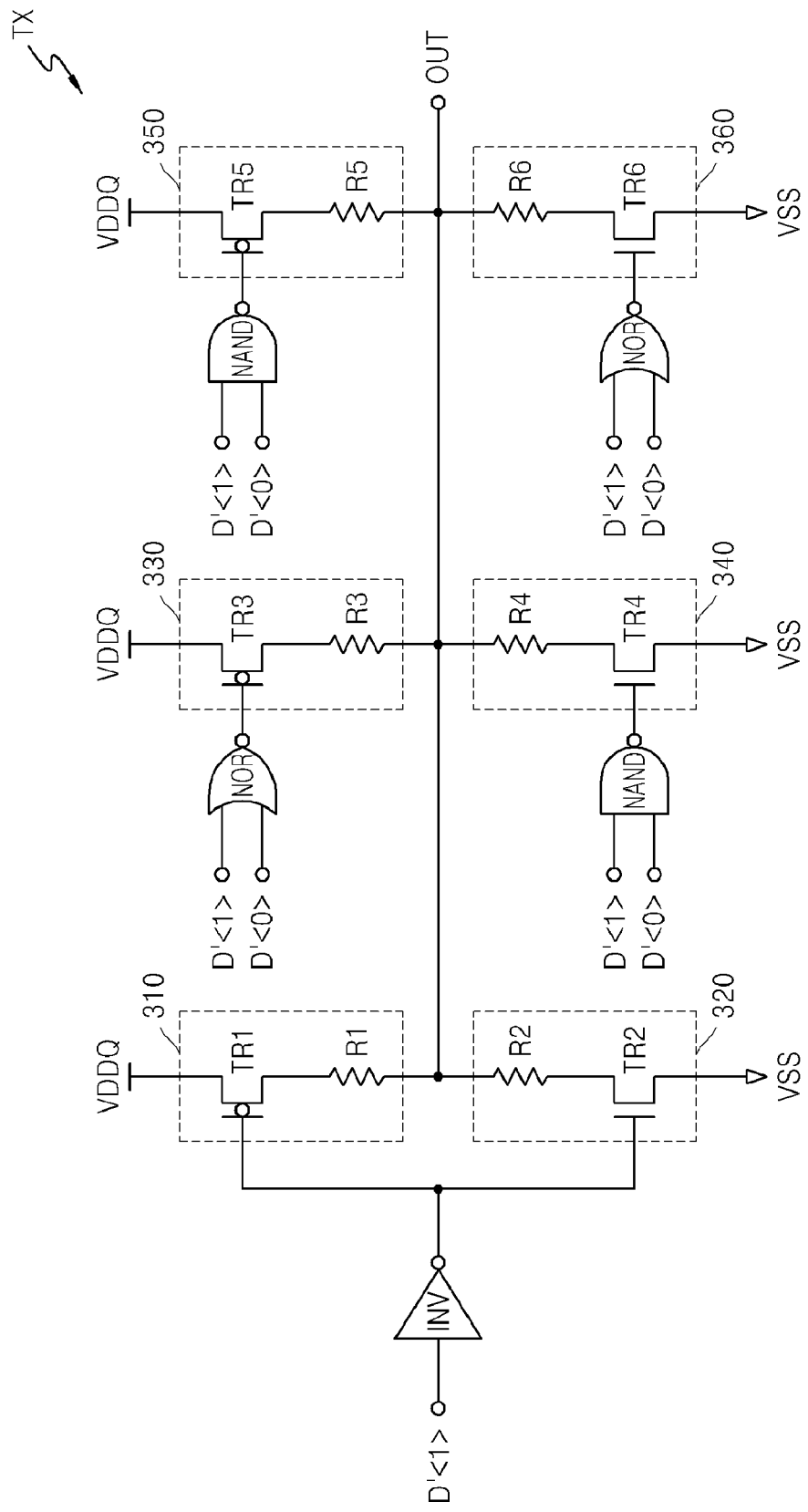
FIG. 3 is a circuit diagram of a transmitter according to an embodiment of the inventive concept.

FIG. 3 is a circuit diagram of a transmitter according to an embodiment of the present inventive concept. In the following description, for convenience of explanation, the transmission unit TX transmitting the first transmission data D0'<1> and D0'<0> is the transmitter TX of FIG. 3. The transmission units TX transmitting the second to fourth transmission data D1'<1>, D1'<0>, D2'<1>, D2'<0>, D3'<1>, and D3'<0> may use the transmitter TX of FIG. 3. However, it is not necessary that the transmission units TX of FIG. 1 must be the transmitter TX of FIG. 3. A transmitter of a different type capable of transmitting data using a multilevel signal may be used therefor. Also, it is not necessary that the transmitter TX of FIG. 3 must be used for the semiconductor device 100 of FIG. 1. The transmitter may be used for other semiconductor devices transmitting data.

Referring to FIGS. 1-3, the transmitter TX may include a first voltage control unit 310, a second voltage control unit 320, a third voltage control unit 330, a fourth voltage control unit 340, a fifth voltage control unit 350, and a sixth voltage control unit 360.

The first voltage control unit 310 may disconnect a power voltage source VDDQ and an output terminal OUT of the transmitter TX when the MSB D0'<1> of the first transmission data D0'<1> and D0'<0> is in the first logic state. The second voltage control unit 320 may disconnect a ground voltage source VSS and the output terminal OUT of the transmitter TX when the MSB D0'<1> of the first transmission data D0'<1> and D0'<0> is in the second logic state. The third voltage control unit 330 may disconnect the power voltage source VDDQ and the output terminal OUT of the transmitter TX when the MSB D0'<1> and the LSB D0'<0> of the first transmission data D0'<1> and D0'<0> are in the first logic state. The fourth voltage control unit 340 may disconnect the ground voltage source VSS and the output terminal OUT of the transmitter TX when the MSB D0'<1> and the LSB D0'<0> of the first transmission data D0'<1> and D0'<0> are in the second logic state. The fifth voltage control unit 350 may disconnect the power voltage source VDDQ and the output terminal OUT of the transmitter TX when the MSB D0'<1> and the LSB D0'<0> of the first transmission data D0'<1> and D0'<0> are in the second logic state. The sixth voltage control unit 360 may disconnect the ground voltage source VSS and the output terminal OUT of the transmitter TX when the MSB D0'<1> and the LSB D0'<0> of the first transmission data D0'<1> and D0'<0> are in the first logic state.

The transmitter TX may further include an inverter INV, a NOR gate (NOR), and a NAND gate (NAND). The inverter INV may inversely output the MSB D0'<1> of the first transmission data D0'<1> and D0'<0>. The NOR gate NOR may perform a NOR operation on the MSB D0'<1> and the LSB D0'<0> of the first transmission data D0'<1> and D0'<0>. The NAND gate NAND may perform a NAND operation on the MSB D0'<1> and the LSB D0'<0> of the first transmission data D0'<1> and D0'<0>.

The first voltage control unit 310 may include a first transistor TR1 and a first resistor R1. An output signal of the inverter INV is applied to a gate of the first transistor TR1 and the power voltage source VDDQ may be connected to a first end of the first transistor TR1. The first resistor R1 may be connected between a second end of the first transistor TR1 and the output terminal OUT of the transmitter TX.

The second voltage control unit 320 may include a second transistor TR2 and a second resistor R2. The output signal of the inverter INV is applied to a gate of the second transistor TR2 and the ground voltage source VSS may be connected to a first end of the second transistor TR2. The second resistor R2 may be connected between a second end of the second transistor TR2 and the output terminal OUT of the transmitter TX.

The third voltage control unit 330 may include a third transistor TR3 and a third resistor R3. An output signal of the NOR gate NOR is applied to a gate of the third transistor TR3 and the power voltage source VDDQ may be connected to a first end of the third transistor TR3. The third resistor R3 may be connected between a second end of the third transistor TR3 and the output terminal OUT of the transmitter TX.

The fourth voltage control unit 340 may include a fourth transistor TR4 and a fourth resistor R4. The output signal of the NOR gate NOR is applied to a gate of the fourth transistor TR4 and the ground voltage source VSS may be connected to a first end of the fourth transistor TR4. The fourth resistor R4 may be connected between a second end of the fourth transistor TR4 and the output terminal OUT of the transmitter TX.

The fifth voltage control unit 350 may include a fifth transistor TR5 and a fifth resistor R5. An output signal of the NAND gate NAND is applied to a gate of the fifth transistor TR5 and the power voltage source VDDQ may be connected to a first end of the fifth transistor TR5. The fifth resistor R5 may be connected between a second end of the fifth transistor TR5 and the output terminal OUT of the transmitter TX.

The sixth voltage control unit 360 may include a sixth transistor TR6 and a sixth resistor R6. The output signal of the NAND gate NAND is applied to a gate of the sixth transistor TR6 and the ground voltage source VSS may be connected to a first end of the sixth transistor TR6. The sixth resistor R6 may be connected between a second end of the sixth transistor TR6 and the output terminal OUT of the transmitter TX.

In the above description, the first transistor TR1, the third transistor TR3, and the fifth transistor TR5 may be PMOS transistors and the second transistor TR2, the fourth transistor TR4, and the sixth transistor TR6 may be NMOS transistors. Also, the first to sixth resistors R1-R6 may have the same resistance.

FIG. 4 is a table showing the voltages Vout at the output terminal OUT of the transmitter TX of FIG. 3 according to the logic states of the first transmission data D0'<1> and D0'<0> applied to the transmitter TX. The operation of the transmitter TX and the voltage Vout of the output terminal OUT of the transmitter TX according to the logic states of the first transmission data D0'<1> and D0'<0> will be described below with reference to FIGS. 3 and 4. In the following description, the first to sixth resistors R1-R6 are assumed to have the same resistance.

When the MSB D0'<1> and the LSB D0'<0> of the first transmission data D0'<1> and D0'<0> are all in the logic high state H, the output signal of the inverter INV is in the logic low state so that the first transistor TR1 is turned on and the second transistor TR2 is turned off. Since the output signals of the NOR gate NOR and the NAND gate NAND are all in the logic low state, the third and fifth transistors TR3 and TR5 are turned on and the fourth and sixth transistors TR4 and TR6 are turned off. Thus, the voltage Vout of the output terminal OUT of the transmitter TX has the same voltage level as that of the power voltage source VDDQ. Also, since all transistors connected to the ground voltage source VSS are turned off, current does not flow between the power voltage source VDDQ and the ground voltage source VSS.

Next, when the MSB D0'<1> and the LSB D0'<0> of the first transmission data D0'<1> and D0'<0> are, respectively, in the logic high state H and the logic low state L, the output signal of the inverter INV is in the logic low state so that the first transistor TR1 is turned on and the second transistor TR2 is turned off. Since the output signals of the NOR gate NOR and the NAND gate NAND are, respectively, in the logic low state and the logic high state, the third and fourth transistors TR3 and TR4 are turned on and the fifth and sixth transistors TR5 and TR6 are turned off. Thus, the voltage level of the voltage Vout of the output terminal OUT of the transmitter TX is ⅔ of that of the power voltage source VDDQ. Also, since the fourth transistor TR4 connected to the ground voltage source VSS is turned on, current flows between the power voltage source VDDQ and the ground voltage source VSS.

Next, when the MSB D0'<1> and the LSB D0'<0> of the first transmission data D0'<1> and D0'<0> are, respectively, in the logic low state L and the logic high state H, the output signal of the inverter INV is in the logic high state so that the first transistor TR1 is turned off and the second transistor TR2 is turned on. Since the output signals of the NOR gate NOR and the NAND gate NAND are, respectively, in the logic low state and the logic high state, the third and fourth transistors TR3 and TR4 are turned on and the fifth and sixth transistors TR5 and TR6 are turned off. Thus, the voltage level of the voltage Vout of the output terminal OUT of the transmitter TX is ⅓ of that of the power voltage source VDDQ. Also, since the second and fourth transistors TR2 and TR4 connected to the ground voltage source VSS are turned on, current flows between the power voltage source VDDQ and the ground voltage source VSS.

When the MSB D0'<1> and the LSB D0'<0> of the first transmission data D0'<1> and D0'<0> are all in the logic low state L, the output signal of the inverter INV is in the logic high state so that the first transistor TR1 is turned off and the second transistor TR2 is turned on. Since the output signals of the NOR gate NOR and the NAND gate NAND are all in the logic high state, the third and fifth transistors TR3 and TR5 are turned off and the fourth and sixth transistors TR4 and TR6 are turned on. Thus, the voltage Vout of the output terminal OUT of the transmitter TX has the same voltage level as that of the ground voltage source VSS. Also, since all transistors connected to the power voltage source VDDQ are turned off, current does not flow between the power voltage source VDDQ and the ground voltage source VSS.

As described above, when the data is transmitted using a multilevel signal, even when the logic states of the MSB and the LSB of the data are different, current flows in the transmission unit TX. Thus, according to the illustrated embodiments of the inventive concept, by minimizing a case in which the logic states of the MSB and the LSB of the data are different, the amount of current consumed by a transmitter TX may be reduced, as compared with conventional data transmission approaches.

As noted above, the structure and operation of transmitter(s) TX incorporated within certain embodiments of the invention may vary from application to application. However, FIG. 3 illustrates one example wherein 2 bits of data are transmitted using one of four voltage levels. The transmitter TX generates a multilevel signal using the MSB and the LSB. When a different bit number of data bits is to be transmitted, portions connected to the power voltage source VDDQ and portions connected to the ground voltage source VSS are, respectively, turned ON/OFF so that a multilevel signal having a plurality of voltage levels may be generated.

To turn ON/OFF the portion connected to the power voltage source VDDQ and the portions connected to the ground voltage source VSS, two of the first and second bits are selected from the bits of the data and then controlled. For example, when 3 bits data D<2>, D<1>, and D<0> are transmitted using one of eight voltage levels, the first and second bits may be (D<2>, D<1>), (D<2>, D<0>), (D<1>, D<0>), (D<1>, D<2>), (D<0>, D<2>), or (D<0>, D<1>).

While the inventive concept has been particularly shown and described with reference to exemplary embodiments thereof, it will be understood that various changes in form and details may be made therein without departing from the scope of the following claims.

What is claimed is:

1. A semiconductor device transmitting data using a multilevel signal, the semiconductor device comprising:
    a parity bit control unit configured to generate a parity bit in accordance with a number of the data having a most significant bit (MSB) and a least significant bit (LSB) that are different, and comprising:
        a plurality of XOR gates each configured to perform an exclusive OR operation on an input of the MSB and the LSB of corresponding data,
        a counter configured to count the number of the data and provide a corresponding count value in response to output signals provided by the plurality of XOR gates, and
        a parity bit generation unit configured to generate the parity bit in a first logic state when the count value is less than or equal to half of a total number of the data, or generate the parity bit in a second logic state when the count value is greater than half of the total number of the data;
    a data conversion unit configured to either inversely output one of the MSB and LSB, or output the data without a change in response to the parity bit; and
    a plurality of transmission units configured to transmit data output from the data conversion unit using the multilevel signal.

2. The semiconductor device of claim 1, wherein the parity bit control unit is further configured to generate a parity bit in a first logic state when the number of the data is less than or equal to a total number of the data, and to generate a parity bit in a second logic state when the number of the data is greater than half of the total number of the data.

3. The semiconductor device of claim 2, wherein the data conversion unit is further configured to output the data without a change, in response to the parity bit in the first logic state, and inversely output one of the MSB and the LSB in response to the parity bit in the second logic state.

4. A semiconductor device transmitting data using a multilevel signal, the semiconductor device comprising:
a parity bit control unit configured to generate a parity bit in accordance with a number of the data having a most significant bit (MSB) and a least significant bit (LSB) that are different;
a data conversion unit configured to either inversely output one of the MSB and LSB, or output the data without a change in response to the parity bit; and
a plurality of transmission units configured to transmit data output from the data conversion unit using the multilevel signal, wherein the transmission unit comprises:
a first voltage control unit configured to disconnect a power voltage source and an output terminal of a transmission unit in the plurality of the transmission units when a first bit of the data is in the first logic state;
a second voltage control unit configured to disconnect a ground voltage source and the output terminal of the transmission unit when the first bit of the data is in the second logic state;
a third voltage control unit configured to disconnect the power voltage source and the output terminal of the transmission unit when the first bit and a second bit of the data are in the first logic state;
a fourth voltage control unit configured to disconnect the ground voltage source and the output terminal of the transmission unit when the first bit and the second bit are in the second logic state;
a fifth voltage control unit configured to disconnect the power voltage source and the output terminal of the transmission unit when the first bit and the second bit are in the second logic state; and
a sixth voltage control unit configured to disconnect the ground voltage source and the output terminal of the transmission unit when the first bit and the second bit are in the first logic state.

5. The semiconductor device of claim 4, wherein the transmission unit further comprises an inverter configured to inversely output the first bit,
wherein the first voltage control unit comprises:
a first transistor having a gate receiving an output signal of the inverter and a first end to which the power voltage source is connected; and
a first resistor connected between a second end of the first transistor and an output terminal of the transmission unit, and
wherein the second voltage control unit comprises:
a second transistor having a gate receiving the output signal of the inverter and a first end to which the ground voltage source is connected; and
a second resistor connected between a second end of the second transistor and the output terminal of the transmission unit.

6. The semiconductor device of claim 4, wherein the transmission unit further comprises:
a NOR gate configured to perform a NOR operation on the first and second bits and output a NOR result; and
a NAND gate configured to perform a NAND operation on the first and second bits and output a NAND result,
wherein the third voltage control unit comprises:
a third transistor having a gate receiving the NOR result and a first end to which the power voltage source is connected; and
a third resistor connected between a second end of the third transistor and the output terminal of the transmission unit,
wherein the fourth voltage control unit comprises:
a fourth transistor having a gate receiving the NAND result and a first end to which the ground voltage source is connected; and
a fourth resistor connected between a second end of the fourth transistor and the output terminal of the transmission unit,
wherein the fifth voltage control unit comprises:
a fifth transistor having a gate receiving the NAND result and a first end to which the power voltage source is connected; and
a fifth resistor connected between a second end of the fifth transistor and the output terminal of the transmission unit, and
wherein the sixth voltage control unit comprises:
a sixth transistor having a gate receiving the NOR result and a first end to which the ground voltage source is connected; and
a sixth resistor connected between a second end of the sixth transistor and the output terminal of the transmission unit.

7. A transmitter transmitting data using a multilevel signal, the transmitter comprising:
a first voltage control unit configured to disconnect a power voltage source and an output terminal of the transmitter when a first bit of the data is in a first logic state;
a second voltage control unit configured to disconnect a ground voltage source and the output terminal of the transmitter when the first bit of the data is in a second logic state;
a third voltage control unit configured to disconnect the power voltage source and the output terminal of the transmitter when the first bit and a second bit of the data are in the first logic state;
a fourth voltage control unit configured to disconnect the ground voltage source and the output terminal of the transmitter when the first bit and the second bit are in the second logic state;
a fifth voltage control unit configured to disconnect the power voltage source and the output terminal of the transmitter when the first bit and the second bit are in the second logic state; and
a sixth voltage control unit disconnecting the ground voltage source and the output terminal of the transmitter when the first bit and the second bit are in the first logic state.

8. The transmitter of claim 7, further comprising:
an inverter configured to inversely output the first bit, and
wherein the first voltage control unit comprises:
a first transistor having a gate receiving an output signal of the inverter and a first end to which the power voltage source is connected; and
a first resistor connected between a second end of the first transistor and an output terminal of the transmitter, and wherein the second voltage control unit comprises:
    a second transistor having a gate receiving the output signal of the inverter and a first end to which the ground voltage source is connected; and
    a second resistor connected between a second end of the second transistor and the output terminal of the transmitter.

9. The transmitter of claim 7, further comprising:
a NOR gate configured to perform a NOR operation on the first and second bits and output a NOR result; and
a NAND gate configured to perform a NAND operation on the first and second bits and output a NAND result,
wherein the third voltage control unit comprises:
    a third transistor having a gate receiving the NOR result and a first end to which the power voltage source is connected; and
    a third resistor connected between a second end of the third transistor and the output terminal of the transmitter,
wherein the fourth voltage control unit comprises:
    a fourth transistor having a gate receiving the NAND result and a first end to which the ground voltage source is connected; and
    a fourth resistor connected between a second end of the fourth transistor and the output terminal of the transmitter,
wherein the fifth voltage control unit comprises:
    a fifth transistor having a gate receiving the NAND result and a first end to which the power voltage source is connected; and
    a fifth resistor connected between a second end of the fifth transistor and the output terminal of the transmitter, and
wherein the sixth voltage control unit comprises:
    a sixth transistor having a gate receiving the NOR result and a first end to which the ground voltage source is connected; and
    a sixth resistor connected between a second end of the sixth transistor and the output terminal of the transmitter.

* * * * *